US012740378B2

(12) United States Patent
Cho et al.

(10) Patent No.: US 12,740,378 B2
(45) Date of Patent: Sep. 15, 2026

(54) CERAMIC SUSCEPTOR

(71) Applicant: MiCo Ceramics Ltd., Anseong-si (KR)

(72) Inventors: Mina Cho, Anseong-si (KR); Eunbi Kim, Anseong-si (KR)

(73) Assignee: MiCo Ceramics Ltd., Anseong-si (KR)

( * ) Notice: Subject to any disclaimer, the term of this patent is extended or adjusted under 35 U.S.C. 154(b) by 0 days.

(21) Appl. No.: 18/760,070

(22) Filed: Jul. 1, 2024

(65) Prior Publication Data

US 2025/0079233 A1 Mar. 6, 2025

(30) Foreign Application Priority Data

Aug. 31, 2023 (KR) ........................ 10-2023-0115542

(51) Int. Cl.
*H01L 21/68* (2006.01)
*H10P 72/00* (2026.01)
*H10P 72/76* (2026.01)

(52) U.S. Cl.
CPC .......... *H10P 72/7624* (2026.01); *H10P 72/06* (2026.01); *H10P 72/7616* (2026.01)

(58) Field of Classification Search
CPC ......... H01L 21/68785; H01L 21/67242; H01L 21/68757
See application file for complete search history.

(56) References Cited

U.S. PATENT DOCUMENTS

2003/0089687 A1* 5/2003 Maki ................ H01J 37/32559 219/121.52
2003/0123213 A1 7/2003 Kosakai
2009/0002913 A1* 1/2009 Naim .................... H02N 13/00 279/128
2017/0032935 A1 2/2017 Benjamin et al.
2018/0090361 A1 3/2018 Sasaki et al.
2019/0019713 A1 1/2019 Hidaka et al.

FOREIGN PATENT DOCUMENTS

CN 104241181 A 12/2014
CN 108475657 A 8/2018
CN 219457560 U 8/2023
JP 2002134489 A 5/2002
KR 20050025497 A 3/2005
KR 20060063182 A * 6/2006 ............ H02N 13/00
KR 20060120812 A 11/2006
KR 20110040508 A 4/2011
KR 20110080336 A 7/2011
KR 1020110099974 A 9/2011
(Continued)

OTHER PUBLICATIONS

Korean Patent Office, Office Action Issued on Nov. 2, 2023.
Korean Patent Office, Notice of Allowance Issued on Mar. 25, 2024.

*Primary Examiner* — Yuechuan Yu
(74) *Attorney, Agent, or Firm* — NKL Law; Jae Youn Kim

(57) ABSTRACT

Disclosed is to a ceramic susceptor. The ceramic susceptor of the present disclosure may include: a base substrate having a gas flow path configured to supply cooling gas; an insulating plate fixed on the base substrate and having a gas hole penetrating the insulating plate in the thickness direction thereof; and a discharge prevention pin inserted into the gas hole and extending in the length direction of the gas hole.

10 Claims, 6 Drawing Sheets

(56) References Cited

FOREIGN PATENT DOCUMENTS

| | | | |
|---|---|---|---|
| KR | 101087140 | B1 | 11/2011 |
| KR | 20120133326 | A | 12/2012 |
| KR | 20180024856 | A | 3/2018 |
| KR | 20180035685 | A | 4/2018 |
| KR | 20200133465 | A | 11/2020 |
| KR | 102259728 | B1 | 6/2021 |
| TW | 202004983 | A | 1/2020 |
| TW | 202307912 | A | 2/2023 |

* cited by examiner

CERAMIC SUSCEPTOR

CROSS-REFERENCE TO RELATED APPLICATION(S)

This application is based on and claims priority under 35 U.S.C. 119 to Korean Patent Application No. 10-2023-0115542, filed on Aug. 31, 2023, in the Korean Intellectual Property Office, the disclosure of which is herein incorporated by reference in its entirety.

BACKGROUND OF THE INVENTION

1. Field of the Invention

The present disclosure relates to a ceramic susceptor, and particularly to an abnormal discharge prevention pin for a gas hole.

2. Description of the Prior Art

In general, a semiconductor device or a display device is manufactured through a semiconductor process of sequentially laminating a plurality of thin film layers including a dielectric layer and a metal layer on a glass substrate, a flexible substrate, or a semiconductor wafer substrate and then patterning the thin film layers. In particular, in reactive ion etching (RIE) equipment or the like, a ceramic susceptor may be placed to support a glass substrate, a flexible substrate, a semiconductor wafer substrate, and the like and to perform a dry etching process for patterning or the like. The ceramic susceptor may include a radio frequency (RF) electrode to be also used to form plasma in an etching process of thin film layers formed on a substrate. In addition, the ceramic susceptor may further include a chuck electrode for supporting a substrate, a heating line for heating a substrate, or the like.

FIGS. 1A to 1C are views illustrating problems in conventional ceramic susceptors. FIGS. 1A and 1B are photographs each showing an example of arcing occurring in a gas hole portion of a conventional ceramic susceptor during a dry etching process. FIG. 1C is a photograph showing the wear state of a discharge prevention pin inserted into a gas hole of a conventional ceramic susceptor.

Referring to FIGS. 1A to 1C, the lifespan of a ceramic susceptor is generally 5,000 hours to 15,000 hours and may be used for about 10 to 30 months depending on the usage environment. At this time, the discharge prevention pin applied to the gas hole portion of the ceramic susceptor is exposed to plasma for a long period of time and wear occurs as shown in FIG. 1C. Accordingly, when discharge prevention pins, which are usually inserted into gas holes with a diameter of 1 mm or less and have a diameter smaller than that of the gas holes, have poor anti-plasma properties, there is a problem in that the pins are worn seriously enough to cause arcing, as shown in FIGS. 1A and 1B. Since this problem affects the lifespan of the ceramic susceptor, it is necessary to solve or alleviate this problem.

SUMMARY OF THE INVENTION

Therefore, the present disclosure was made to solve the above-mentioned problem, and is to provide a ceramic susceptor in which the anti-plasma properties of discharge prevention pins for gas holes, thereby reducing the occurrence of arcing and improving the lifespan of the ceramic susceptor.

In summary, a ceramic susceptor according to an aspect of the present disclosure may include: a base substrate having a gas flow path configured to supply cooling gas; an insulating plate fixed on the base substrate and having a gas hole penetrating the insulating plate in the thickness direction thereof; and a discharge prevention pin inserted into the gas hole and extending in the length direction of the gas hole.

The discharge prevention pin may be made of a material with a volume resistance in a range of 1E14 to 1E15 Ωcm.

The discharge prevention pin has a cross-sectional area of an end that is 50 to 90% of the cross-sectional area of the gas hole.

The discharge prevention pin may be made of a material that includes an $Al_2O_3$—SiC composite.

The $Al_2O_3$—SiC composite material may contain 3 to 10 wt % of SiC.

The $Al_2O_3$—SiC composite material may have a volume resistance of 1E15 Ωcm or higher at room temperature and 1E14 Ωcm or higher at 200° C.

The discharge prevention pin may be inserted into the gas hole with a diameter of 1 mm or less.

The electrode layer may include one or more of an electrostatic chuck electrode, a radio frequency (RF) electrode, and a heating wire.

In the ceramic susceptor according to the present disclosure, by using a material obtained by mixing SiC to $Al_2O_3$ by 3 to 10 wt % as the material for the discharge prevention pins of the gas holes, the plasma etch rate can be set to be in the range of 0.02 to 0.1 μm/min, and the volume resistance of the material can be set to be 1E15 Ωcm or higher at room temperature and 1E14 Ωcm or lower at 200° C., thereby improving plasma resistance and increasing the lifespan of the ceramic susceptor. That is, the discharge prevention pins of the present disclosure do not wear out due to the improved plasma resistance, and prevent the occurrence of spaces in which electrons accelerate in the gas holes, thereby preventing abnormal discharge. In addition, by maintaining the volume resistance of the material as described above, it is possible to prevent the occurrence of a high potential difference that may cause abnormal discharge when resistance is high and to prevent an increase in current that may cause abnormal discharge when resistance is low.

BRIEF DESCRIPTION OF THE DRAWINGS

The accompanying drawings, which are included as a part of a detailed description to help the understanding of the present disclosure, provide embodiments of the present disclosure, and illustrate the technical spirit of the present disclosure together with the detailed description, in which.

DETAILED DESCRIPTION OF THE EXEMPLARY EMBODIMENTS

Figure 1A:
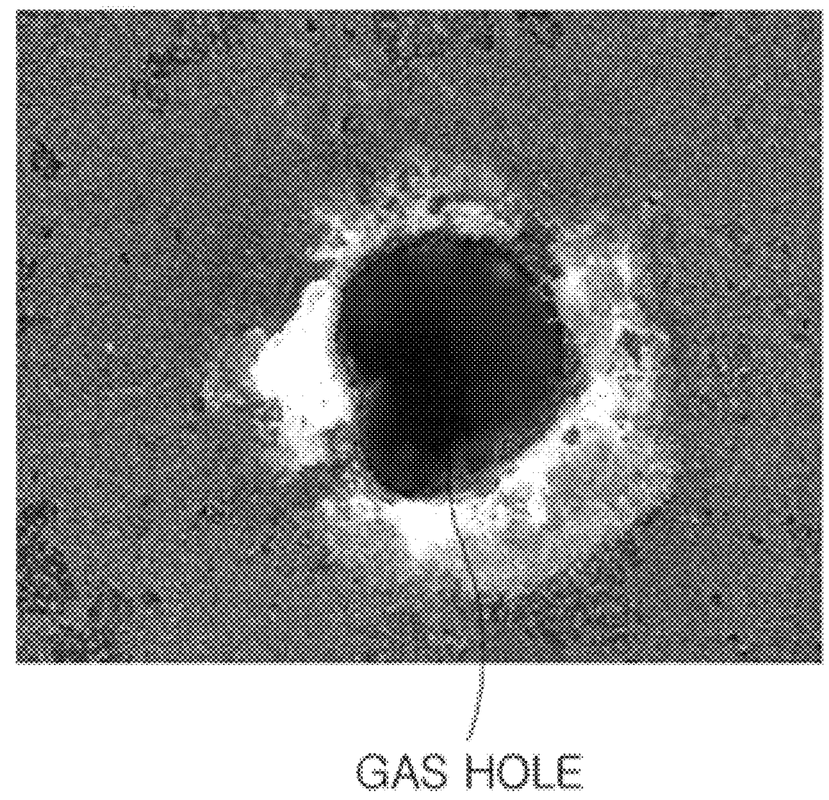
FIGS. 1A, 1B and 1C are views illustrating problems in conventional ceramic susceptors.

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size. Therefore, the descriptions provided herein are not limited by the relative sizes or spacings of the components drawn in each drawing.

In describing the embodiments of the present disclosure, when a detailed description of the known technology related to the present disclosure is determined to unnecessarily obscure the subject matter of the present disclosure, the detailed description will be omitted. In addition, terms to be described later are defined in consideration of functions in the present disclosure, and may vary according to the intention, custom, or the like of a user or operator. Therefore, the definitions of the terms should be made based on the description throughout this specification. Terms used in the detailed description are only for describing the embodiments of the present disclosure, and should in no way be limiting. Unless expressly used otherwise, singular expressions include the meanings of plural expressions. As used herein, expressions such as “including” or “comprising” are intended to indicate any features, numbers, steps, operations, elements, or some or combinations thereof, and should not be construed to exclude the existence or possibility of one or more other features, numbers, steps, operations, elements, or some or combinations thereof, in addition to those described above.

In addition, terms such as “first” and “second” may be used to describe various components, but the components are not limited by the terms, and these terms are only used for the purpose of distinguishing one component from another.

First, in the present disclosure, a ceramic susceptor is a semiconductor device used for processing substrates to be processed for various purposes such as a semiconductor wafer, a glass substrate, and flexible substrate. The ceramic susceptor may include an electrostatic chuck electrode to be used as an electrostatic chuck to support a processing-target substrate, may include a heating wire (or heating element) for a heater to heat a processing-target substrate to a predetermined temperature, or may include a RF electrode in addition to or instead of the heating wire for performing processing, such as plasma enhanced chemical vapor deposition, on a processing-target substrate. For example, the ceramic susceptor of the present disclosure may be applicable not only to reactive ion etching (RIE) equipment, but also to equipment for a chemical vapor deposition (CVD) process, a physical vapor deposition (PVD) process, or the like.

Therefore, as described below, the ceramic susceptor of the present disclosure is a structure obtained by bonding a base substrate including a gas flow path and an insulating plate including an electrode layer. The electrode layer provided on the insulating plate is to be understood as including conductors to implement the functions of one or more of the above-mentioned electrostatic chuck electrode, RF electrode, and heating wire (or heating element).

Figure 2:
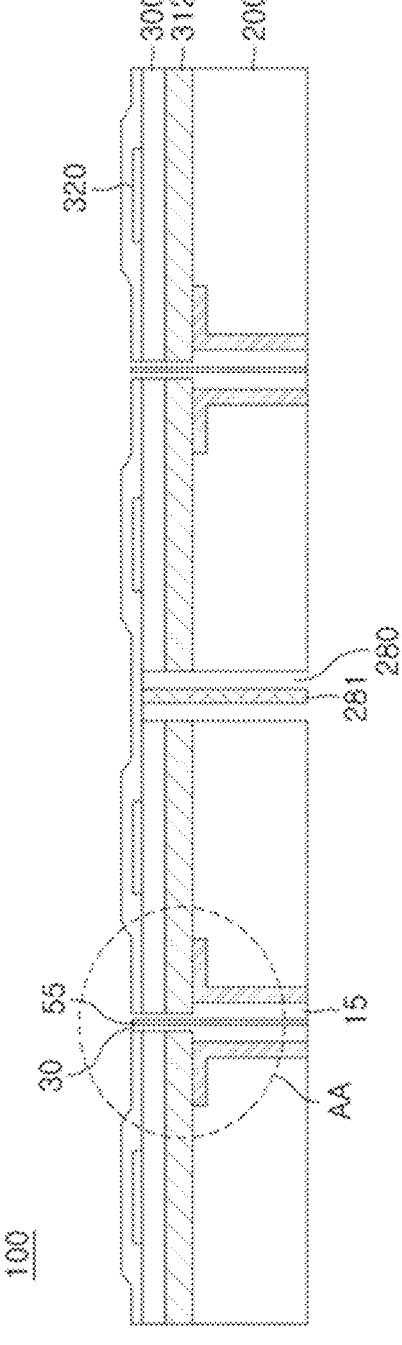
FIG. 2 is a schematic cross-sectional view of a ceramic susceptor according to an embodiment of the present disclosure.

FIG. 2 is a schematic cross-sectional view of a ceramic susceptor 100 according to an embodiment of the present disclosure.

Referring to FIG. 2, the ceramic susceptor 100 according to an embodiment of the present disclosure includes a base substrate 200 and an insulating plate 300 which are bonded to each other with a bonding agent 312. The ceramic susceptor 100 is preferably of a circular type, but in some cases, may be designed in another shape such as oval or square.

The base substrate 200 may be configured as a multi-layer structure including a plurality of metal layers. These metal layers may be bonded through a brazing process, a welding process, a bonding process, or the like. The insulating plate 300 is fixed on the base substrate 200, and may be fixed on the base substrate 200 with certain fixing means or adhesive/bonding means. The base substrate 200 and the insulating plate 300 may be manufactured separately and then bonded to each other. In some cases, it is possible to provide the structure of the insulating plate 300 directly on the top surface of the base substrate 200 using a ceramic sheet or the like.

As illustrated in FIG. 2, the insulating plate 300 includes an electrode layer 320 disposed between ceramic sheets or ceramic materials made of powder. In an embodiment, the ceramic materials may be made of a material selected from among materials such as aluminum oxide ($Al_2O_3$), aluminum nitride (AlN), silicon carbide (SiC), silicon nitride ($Si_3N_4$), silicon oxide ($SiO_2$), barium oxide (BaO), zinc oxide (ZnO), cobalt oxide (CoO), tin oxide ($SnO_2$), zirconium oxide ($ZrO_2$), $Y_2O_3$, YAG, YAM, and YAP. The insulating plate 300 may be formed on the top surface of the base substrate 200 using the above-mentioned ceramic materials by performing a thermal spray coating process, a ceramic sheet bonding process, or the like.

The electrode layer 320 may be made of a conductive metal material. As an example, the electrode layer 320 may be made of at least one of silver (Ag), gold (Au), nickel (Ni), tungsten (W), molybdenum (Mo), and titanium (Ti). More preferably, the electrode layer 320 may be made of tungsten (W). The electrode layer 320 may be provided through a thermal spray coating process or a screen printing process. The electrode layer 320 has a thickness of about 1.0 μm to 100 μm. For example, preferably, when providing the electrode layer 320 through a screen printing process, a thickness of 1.0 to 30 μm may be applied, and when providing the electrode layer 320 through the thermal spray coating process, a thickness of 30 to 100 μm may be applied. However, an excessively thin electrode layer 320 (e.g., less than 1.0 μm) is difficult to fabricate and thus undesirable. This case is also undesirable because the resistance value increases due to porosity and other defects in the electrode layer, and an electrostatic attractive force may decrease with the increase of the resistance value. In addition, an excessively thick electrode layer 320 (e.g., exceeding 100 μm) may cause arcing and is thus undesirable. Therefore, it is desirable to apply the electrode layer 320 to have an appropriate thickness in the range of about 1.0 μm to 100 μm. The electrode layer 320 fabricated in this way may be an electrostatic chuck that is capable of receiving a bias to generate an electrostatic force when loading a substrate (not illustrated) to be placed on the dielectric layer 330, thereby chucking the substrate, and that is capable of applying an opposite bias to the electrode layer 320 to cause discharge when unloading a substrate (not illustrated), thereby dechucking the substrate.

However, without being limited thereto, in some cases, the electrode layer 320 may further include electrode patterns for a heater or RF electrode patterns for plasma generation. That is, the ceramic susceptor 100 of the present disclosure is a semiconductor apparatus used for processing processing-target substrates for various purposes, such as a semiconductor wafer, a glass substrate, and flexible substrate. The ceramic susceptor may include an electrostatic chuck electrode on the electrode layer 320 to be used as an electrostatic chuck to support a substrate to be processed, and may include a heating line (or a heating element) to heat a substrate to be processed to a predetermined temperature. Alternatively, the ceramic susceptor may further include an RF electrode or may include an RF electrode instead of the heating wire for processing, such as plasma enhanced chemical vapor deposition, on a processing-target substrate.

In the case where the ceramic susceptor 100 is mounted inside a chamber for a semiconductor process, a plurality of cooling gas holes 30 provided in the insulating plate 300 to be in fluid communication with the cooling gas flow path 15 in the base substrate 200 may be provided in order to uniformly cool the substrate (e.g., a glass substrate, flexible substrate, a semiconductor wafer substrate, or the like) on the insulating plate 300 with an external cooling gas.

In addition, in the ceramic susceptor 100 according to the present disclosure, each discharge prevention pin 55 is inserted into each gas hole 30. Therefore, for example, in a semiconductor process such as an etching process, when RF voltage having higher frequencies and RF voltage having lower frequencies are applied simultaneously or separately to the electrode layer 320 through the electrode rod 281 of the base substrate 200, the etching process can be performed stably by suppressing abnormal discharge such as micro arcing or parasitic plasma.

Figure 3:
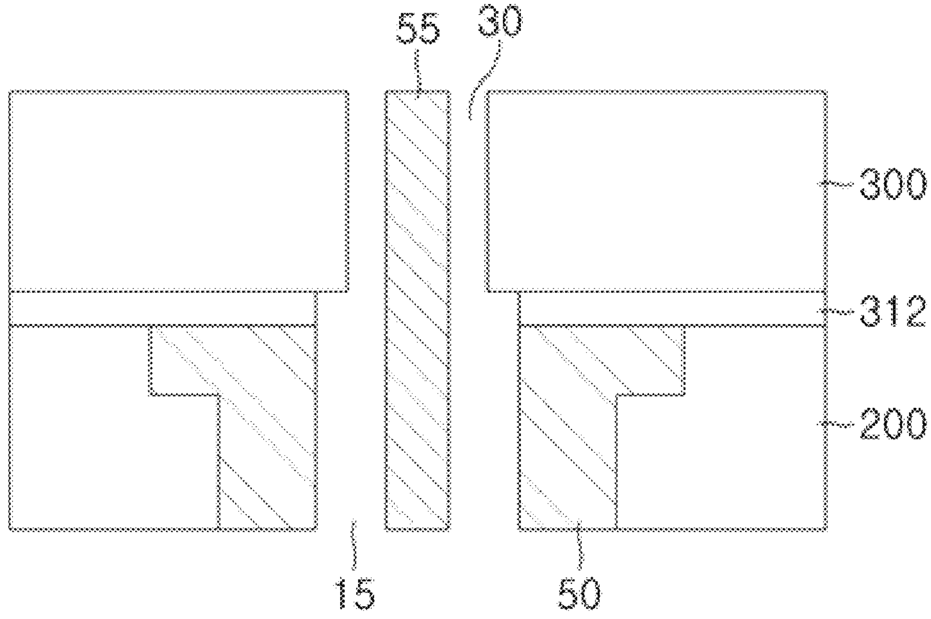
FIG. 3 is an enlarged cross-sectional view taken along line A-A in FIG. 2.

FIG. 3 is an enlarged cross-sectional view taken along line A-A in FIG. 2.

Referring to FIG. 3, for example, the base substrate 200 has a cooling gas flow path 15 in an appropriate pattern as illustrated in FIG. 2 to supply a cooling gas. The cooling gas flow path 15 may be pre-formed in the metal material of the base substrate 200. For example, the upper end of the cooling gas flow path 15 may be a through hole provided in a pore structure 50 that is present inside the base substrate 200 as illustrated in the drawing. In the process of manufacturing the ceramic susceptor 100 of the present disclosure, the insulating plate 300 may be bonded to the base substrate 200 using a bonding agent 312.

The base material 200 and the insulating plate 300 can be firmly boned to each other through compression, sintering, and hardening. Thereafter, a hole penetrating the insulating plate 300 and the bonding layer by the bonding agent 312 may be machined at the position of the gas hole 30 through machining by a machining center (MCT) or, if necessary, a hole that further penetrates the pore structure 50 in the base material 200 may be further machined, which enables fluid communication between the gas flow path 15 and the gas hole 30 to be achieved. Such holes may be machined through laser machining by MCT, and thus holes with a diameter of several mm or less, or preferably with a diameter of 1 mm or less, may be machined.

The cooling gas holes 30 in the insulating plate 300 penetrating the insulating plate 300 in the thickness direction are capable of injecting cooling gas from the gas flow path 15 to uniformly cool the substrate on the insulating plate 300. Here, the description "penetrating in the thickness direction" refer to the state in which the gas holes 30 are arranged to provide an arbitrary passage connecting the top and bottom surfaces of the insulating plate 300, and as a specific penetrating type, a type in which a passage penetrates the entire insulating plate 300 directly downward from the surface of the insulating plate 300 or a type in which a combination of vertical passages and horizontal passages penetrates the plate 300 may be used. In this case, helium gas (He) may be mainly, but not necessarily, used as the cooling gas. The insulating plate 300 may be provided with an appropriate number of cooling gas holes 30 depending on the design.

In FIG. 2, for example, for chucking and dechucking, or for heating or providing RF waves, a bias may be applied to the electrode layer 320 from at least one electrode rod 281 provided through a hole 280 in the lower portion of the ceramic susceptor 100. An appropriate number of cooling gas holes 30 may be provided between predetermined electrode patterns of the electrode layer 320 depending on the design, and the cooling gas holes 30 may be provided such that fluid communication of the cooling gas from the cooling gas flow path 15 to the insulating plate 300 can be achieved through the cooling gas holes 30.

In addition, in the ceramic susceptor 100 according to the present disclosure, each discharge prevention pin 55 is inserted into each gas hole 30. Therefore, for example, in a semiconductor process such as an etching process, when RF voltage having higher frequencies and RF voltage having lower frequencies are applied simultaneously or separately to the electrode layer 320 through the electrode rod 281 of the base substrate 200, the etching process can be performed stably by suppressing abnormal discharge such as micro arcing or parasitic plasma.

Each discharge prevention pin 55 is inserted into each gas hole 30 with a diameter of several mm or less, or preferably 1 mm or less, and the diameter of the discharge prevention pin is set to be appropriately smaller than the diameter of the gas hole 30. For example, the discharge prevention pin 55 has a cross-sectional area of an end that is preferably 50 to 90% of the cross-sectional area of the gas hole 30. Accordingly, it is desirable to allow the cooling gas to sufficiently flow through the gap between the gas hole 30 and the discharge prevention fin 55.

The discharge prevention pin 55 may be inserted into the gas hole 30 to extend downward in the length direction of the gas hole 30 such that the discharge prevention pin can be fixed in various fixing ways, and it is desirable to prevent the discharge prevention pin from protruding above the gas hole 30. For example, it is desirable that the height of the end of the gas hole 30 and the height of the end of the discharge prevention pin 55 are the same. However, the height of the end of the discharge prevention pin 55 should not be lower than the height of the end of the gas hole 30.

Figure 4:
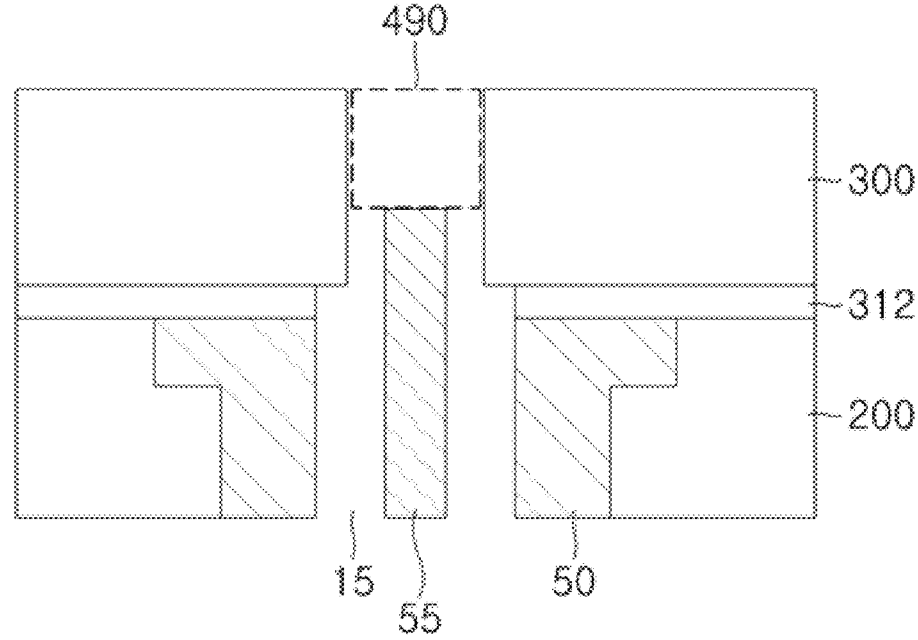
FIG. 4 is a view illustrating abnormal discharge due to wear of an abnormal discharge prevention pin in a gas hole portion in FIG. 2.

FIG. 4 is a view illustrating abnormal discharge due to wear of an abnormal discharge prevention pin 55 in a gas hole portion 15 in FIG. 2.

Figure 1B:
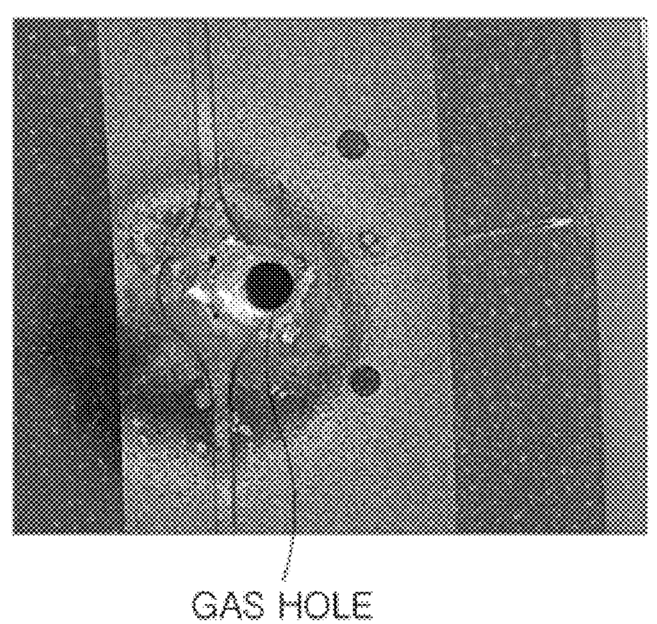
Figure 1C:
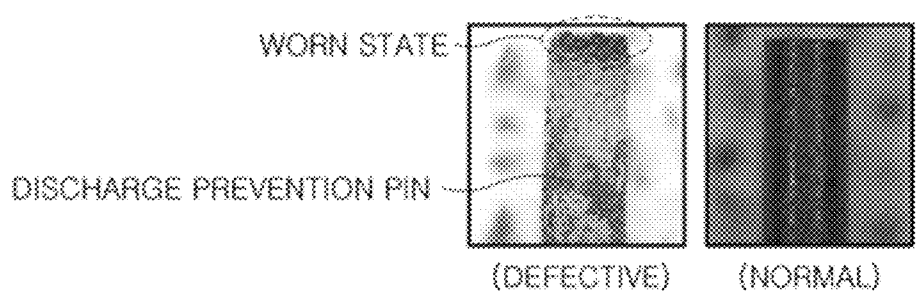

Referring to FIG. 4, the discharge prevention pin 55 may ensure that a process using plasma is performed stably. However, in the case where there is no discharge prevention pin 55 or in the case where the upper end portion of the discharge prevention pin 55 is worn as illustrated in the drawing and a space 490 occurs in the upper portion of the gas hole 30, while a process using plasma is being performed in semiconductor equipment as described above, abnormal discharge may occur in the gas hole 30 depending on conditions such as the pressure of the gas in a reactor, voltage, and the size (the largest distance or volume) of the space 490, and arcing may occur as shown in FIGS. 1A and 1B, preventing the plasma process from proceeding.

In order to suppress such abnormal discharge in the ceramic susceptor 100, it is important to ensure that electrons cannot be accelerated in the space 490 by preventing the discharge prevention pin 55 from being worn, thereby preventing the occurrence of the space 490 in the upper end portion of the gas hole 30.

For this purpose, preferably, the discharge prevention fin 55 is made of a material that includes an $Al_2O_3$—SiC composite. For example, the $Al_2O_3$—SiC composite material may contain 3 to 10 wt % of SiC. Preferably, the $Al_2O_3$—SiC composite material has a volume resistance of 1E15 Ωcm or higher at room temperature and a volume resistance of 1E14 Ωcm or higher at 200° C.

[Table 1] below shows the arithmetic average roughness (Ra), ten-point average roughness (Rz), etching depth, and etching rate for each of comparative materials (SiC, $Al_2O_3$+SiC mixture, $Al_2O_3$ with purity of 99.9% or higher) for an etching time of 10 minutes in a predetermined plasma generation environment.

TABLE

| | Items | | | | |
|---|---|---|---|---|---|
| | Etch time | Roughness (Ra) | Roughness (Rz) Unit | Etch depth | Etch rate |
| | min | μm | μm | μm | μm/mm |
| SiC | 10 | 0.21 | 0.94 | 2.1 | 0.21 |
| $Al_2O_3$ + SiC | 10 | 0.05 | 0.42 | 0.3 | 0.03 |
| Al2O3 ≥ 99.9% | 10 | 0.01 | 0.05 | 0.01 | 0.001 |

In general, pure $Al_2O_3$ is a high-strength but high-density brittle material, and discharge preventions pins 55 were manufactured using a material mixed with SiC in order to obtain a material resistant to thermal shock. In particular, as shown in [Table 1], the anti-discharge pins 55 made of a mixture of $Al_2O_3$ (e.g., 90 to 97 wt %) and SiC (e.g., 3 to 10 wt %) have a plasma etch rate within the range of 0.02 to 0.1 μm/min (e.g., 0.03 μm/min), which is not high even in in-situ plasma processes for dry etching. Therefore, there was no wear of the discharge prevention pins 55 in the gas holes 30, and occurrence of spaces 490 in the upper end portions of the gas holes 30 were prevented. The etch rate was measured under general process conditions for dry etching using reactive ion etching (RIE) equipment, etc., but there may be slight changes depending on process conditions.

At this time, the volume resistance of the discharge prevention pins 55 is more than 1E15 Ωcm at room temperature and more than 1E14 Ωcm at 200° C., which suppresses the increase in potential difference in the spaces 490 in the upper end portions of the gas holes 30 to prevent electrons from accelerating in the spaces 490, so that abnormal discharge can be prevented. This is because arcing may occur by increasing the potential difference in the gas holes 30 when the volume resistance of the discharge prevention pins 55 is 1E16 Ωcm or higher, and the current is concentrated on the discharge prevention pins 55, which may cause changes in process properties such as plasma etching due to abnormal discharge when the volume resistance of the discharge prevention pins 55 is 1E14 Ωcm or lower.

Figure 5:
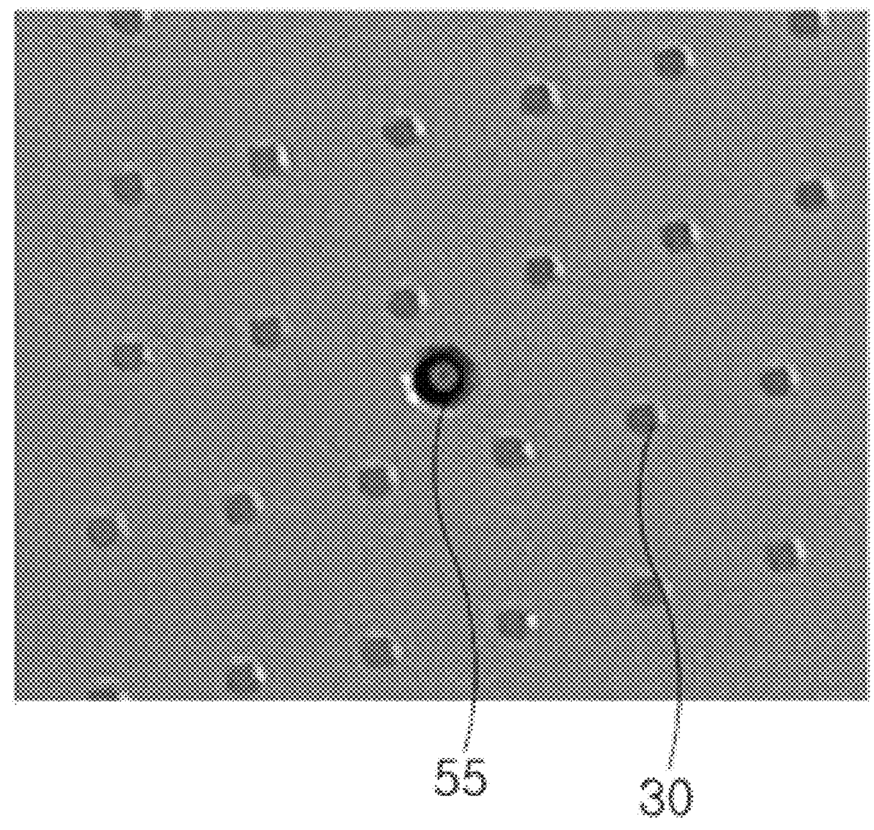
FIG. 5 is an actual experimental photograph showing a clean state without abnormal discharge around gas holes on the top surface of a ceramic susceptor according to an embodiment of the present disclosure.

FIG. 5 is an actual experimental photograph showing a clean state without abnormal discharge around gas holes 30 on the top surface of a ceramic susceptor 100 according to an embodiment of the present disclosure.

As shown in FIG. 5, for example, it was confirmed that a ceramic susceptor 100 according to an embodiment of the present disclosure using discharge prevention pins 55 made of a mixed material of $Al_2O_3$ (e.g., 90 to 97 wt %) and SiC (e.g., 3 to 10 wt %) maintained a clean state around the gas holes 30 without abnormal discharge.

As described above, in the ceramic susceptor 100 according to the present disclosure, by using, for example, a material obtained by mixing SiC to $Al_2O_3$ by 3 to 10 wt % as the material for the discharge prevention pins 55 of the gas holes 30, the plasma etch rate can be set to be in the range of 0.02 to 0.1 μm/min, and the volume resistance of the material can be set to be 1E15 Ωcm or higher at room temperature and 1E14 Ωcm or lower at 200° C., thereby improving plasma resistance and increasing the lifespan of the ceramic susceptor 100. That is, the discharge prevention pins 55 of the present disclosure do not wear out due to the improved plasma resistance, and prevent the occurrence of spaces in which electrons accelerate in the gas holes, thereby preventing abnormal discharge. In addition, by maintaining the volume resistance of the material as described above, it is possible to prevent the occurrence of a high potential difference that may cause abnormal discharge when resistance is high and to prevent an increase in current that may cause abnormal discharge when resistance is low.

In the foregoing, the present disclosure has been described based on specific details, such as specific components, limited embodiments, and drawings, but these are only provided to help a more general understanding of the present disclosure, and the present disclosure is not limited to the above-described embodiments. A person ordinarily skilled in the art to which the present disclosure pertains may make various modifications and changes without departing from the essential characteristics of the present disclosure. Therefore, the spirit of the present disclosure should not be limited to the described embodiments, and not only the appended claims, but also all technical ideas that are equivalent to or equivalently modified to the claims should be interpreted as being included in the scope of the present disclosure.

What is claimed is:

1. A ceramic susceptor comprising:

a base substrate including a pore structure disposed therein, the pore structure having a gas flow path configured to supply cooling gas, wherein the gas flow path is a through hole;

an insulating plate fixed on the base substrate and having a gas hole penetrating the insulating plate in a thickness direction; and a discharge prevention pin inserted into the gas hole and extending in a length direction of the gas hole, wherein the gas hole and the through hole are in fluid communication, wherein the discharge prevention pin extends through the gas hole to at least a portion of the through hole, and wherein the discharge prevention pin includes an $Al_2O_3$—SiC composite material, and the $Al_2O_3$—SiC composite material has a volume resistance of 1E14 Ωcm or higher at 200 °C.

2. The ceramic susceptor of claim 1, wherein the discharge prevention pin is made of a material with a volume resistance in a range of 1E14 to 1E15 Ωcm.

3. The ceramic susceptor of claim 1, wherein the discharge prevention pin has a cross-sectional area of an end that is 50 to 90% of a cross-sectional area of the gas hole.

4. The ceramic susceptor of claim 1, wherein the $Al_2O_3$—SiC composite material contains 3 to 10 wt % of SiC.

5. The ceramic susceptor of claim 1, wherein the $Al_2O_3$—SiC composite material has a volume resistance of 1E15 Ωcm or higher at room temperature.

6. The ceramic susceptor of claim 1, wherein the discharge prevention pin is inserted into the gas hole with a diameter of 1 mm or less.

7. The ceramic susceptor of claim 1, wherein the insulating plate includes an electrode layer, which comprises one or more of an electrostatic chuck electrode, a radio frequency (RF) electrode, and a heating line.

8. The ceramic susceptor of claim 1, wherein the discharge prevention pin is a rod having a cross-sectional area smaller than that of the gas hole.

9. A ceramic susceptor comprising:

a base substrate including a pore structure disposed therein, the pore structure having a gas flow path configured to supply cooling gas, wherein the gas flow path is a through hole;

an insulating plate fixed on the base substrate and having a gas hole penetrating the insulating plate in a thickness direction thereof; and a discharge prevention pin disposed in the gas hole and extending in a length direction of the gas hole, such that a space is formed between an inner surface of the gas hole and an outer surface of the discharge prevention pin, wherein the gas hole and the through hole are in fluid communication, and wherein the discharge prevention pin extends through the gas hole to at least a portion of the through hole, wherein the discharge prevention pin includes an $Al_2O_3$-SiC composite material, and the $Al_2O_3$-SiC composite material has a volume resistance of 1E14 Ωcm or higher at 200 °C.

10. The ceramic susceptor of claim 9, wherein the discharge prevention pin is a rod having a cross-section area smaller than that of the gas hole.

* * * * *